US008940555B2

(12) United States Patent
Bauch (10) Patent No.: US 8,940,555 B2
(45) Date of Patent: Jan. 27, 2015

(54) METHOD AND SYSTEM FOR DETERMINING OVERLAP PROCESS WINDOWS IN SEMICONDUCTORS BY INSPECTION TECHNIQUES

(75) Inventor: Lothar Bauch, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 282 days.

(21) Appl. No.: 13/605,060

(22) Filed: Sep. 6, 2012

(65) Prior Publication Data

US 2014/0065734 A1 Mar. 6, 2014

(51) Int. Cl.
*G01R 31/26* (2014.01)
*H01L 21/66* (2006.01)
(52) U.S. Cl.
USPC .............. 438/14; 257/E21.522; 257/E21.529; 257/E21.53

(58) Field of Classification Search
None
See application file for complete search history.

(56) References Cited

U.S. PATENT DOCUMENTS

2004/0002216 A1* 1/2004 Taussig et al. ................ 438/694

* cited by examiner

*Primary Examiner* — Calvin Choi
(74) *Attorney, Agent, or Firm* — Amerson Law Firm, PLLC (57) ABSTRACT

The formation of overlap areas in sophisticated semiconductor devices is a critical aspect which may not be efficiently evaluated on the basis of conventional measurement and design strategies. For this reason, the present disclosure provides measurement techniques and systems in which overlying device patterns are transformed into the same material layer, thereby forming a combined pattern which is accessible by well-established defect inspection techniques. Upon geometrically modulating some of these combined patterns, a systematic evaluation of overlap process windows may be accomplished.

11 Claims, 4 Drawing Sheets

METHOD AND SYSTEM FOR DETERMINING OVERLAP PROCESS WINDOWS IN SEMICONDUCTORS BY INSPECTION TECHNIQUES

BACKGROUND OF THE INVENTION

1. Field of the Invention

The present disclosure generally relates to the field of fabricating microstructures, such as integrated circuits, and, more particularly, to a technique for determining alignment accuracy and pattern placement precision during patterning processes.

2. Description of the Related Art

The fabrication of microstructures, such as integrated circuits, requires tiny regions of precisely controlled size to be formed in a material layer of an appropriate substrate, such as a silicon substrate, a silicon-on-insulator (SOI) substrate, or other suitable carrier materials. These tiny regions of precisely controlled size are generated by patterning the material layer using lithography, etch, implantation, deposition, oxidation processes and the like, wherein typically, at least in a certain stage of the patterning process, a mask layer may be formed over the material layer to be treated to define these tiny regions. Generally, a mask layer may consist of or may be formed by means of a layer of photoresist that is patterned by a lithographic process, typically a photolithography process. During the photolithography process, the resist may be spin-coated onto the substrate surface and then selectively exposed to radiation through a corresponding lithography mask, such as a reticle, thereby imaging the reticle pattern into resist layer to form a latent image therein. After developing the photoresist, depending on the type of resist, i.e., positive resist or negative resist, the exposed portions or the non-exposed portions are removed to form the required pattern in the layer of photoresist. Based on this resist pattern, actual device patterns may be formed by further manufacturing processes, such as etch, implantation, anneal processes and the like. Since there is a constant demand for reducing the dimensions of the patterns in sophisticated integrated microstructure devices in view of performance enhancement, the process tools and process recipes used for patterning device features have to meet very stringent requirements with regard to resolution and overlay accuracy. In this respect, resolution is considered as a measure for specifying the consistent ability to print minimum size images under conditions of predefined manufacturing variations. One important factor in improving the resolution is the lithographic process, in which patterns contained in the photo mask or reticle are optically transferred to the substrate via an optical imaging system. Therefore, great efforts are made to steadily improve optical properties of the lithographic system, such as numerical aperture, depth of focus and wavelength of the light source used.

The quality of the lithographic imagery is extremely important in creating very small feature sizes. Of at least comparable importance is the accuracy with which an image can be positioned on the surface of the substrate. Typically, microstructures, such as integrated circuits, are fabricated by sequentially patterning material layers, wherein features on successive material layers bear a spatial relationship to one another. Each pattern formed in a subsequent material layer has to be aligned to a corresponding pattern formed in the previously patterned material layer within specified registration tolerances. These registration tolerances are caused by, for example, a variation of a photoresist image on the substrate due to non-uniformities in such parameters as resist thickness, baking temperature, exposure dose and time and development conditions. Furthermore, non-uniformities of the etch processes can also lead to variations of the etched features. In addition, there exists an uncertainty in overlaying the image of the pattern of the current material layer to the etched or otherwise defined pattern of the previously formed material layer while photolithographically transferring the image of the photo mask onto the substrate. Several factors contribute to an imperfect ability of the imaging system to overlay two layers, such as imperfections within a set of masks, temperature differences at the different times of exposure, a limited registration capability of the alignment tool and, as a major contribution to alignment errors, imperfections of the exposure tool itself, such as lens distortions, and distortions caused by the alignment hardware, such as the substrate holder, and the like. The situation becomes even worse when different exposure tools are used for defining subsequent device layers, since then the inherent errors in the exposure tool and related components may vary between the different tools.

Although the same exposure tool might be used for imaging critical device layers, in practice, such restrictions may not allow an efficient overall process flow in a complex manufacturing environment, which typically comprises a plurality of lithography tools for the same device layer. As a result, the dominant criteria for determining the minimum feature size that may finally be obtained are the resolution for creating features in individual substrate layers and the total overlay error to which the above explained factors contribute.

Therefore, it is essential to continuously monitor the resolution, i.e., the capability of reliably and reproducibly creating the minimum feature size, also referred to as critical dimension (CD), within a specific material layer, and to continuously determine the overlay accuracy of patterns of material layers that have been successively formed and that have to be aligned to each other. For example, when forming a wiring structure for an integrated circuit, respective metal lines and vias, which connect two stacked metal regions, may have to be aligned to each other with strict process margins so as to result in a well-defined overlap, since a significant misalignment may cause a short between actually non-connected lines, thereby possibly creating a fatal device defect, while a reduction of the intended overlap area may cause loss of performance due to increased contact and series resistance. Similar criteria holds true for other device layers, which require well-defined overlap areas in order to ensure proper device function.

For these reasons, great efforts are being made in detecting critical overlap areas, i.e., overlap areas which may cause severe device failures or performance degradations when a corresponding deviation from the initial design is generated upon actually implementing the layout of a respective device layer into the material of the semiconductor device. For example, the layout of the several spatially correlated device layers is designed such that a perfect overlap is ensured, which may involve the application of various test strategies on layout level. During the lithography process and subsequent etch processes, however, significant changes of the initial layout pattern may be caused, for instance, by thinning small structures and the like. Generally, a plurality of fluctuations may occur during the transfer of a specific pattern of a layout layer, which is initially transferred into a reticle or lithography mask and in turn is then used for repeatedly imaging the pattern into a material layer on the semiconductor substrate. As discussed above, the various process steps involved in actually forming a desired pattern in a material layer of the semiconductor device may result in a more or less pronounced introduction of process imperfections, for instance, non-perfect alignment of the lithography mask to the semiconductor substrate, process tolerances caused by the imaging process such as lens aberrations and distortions of the substrate by mechanical stress and the like, and also various tolerances during the etch processes may result in inaccuracies of the resulting device patterns, which in turn may thus result in a reduced overlay accuracy. Since the overlap of respective device features of two subsequent device layers may strongly depend on the finally achieved overlay accuracy, in particular in very small three-dimensional structures, great efforts are being made in identifying critical overlap areas and in enhancing the overall overlay accuracy. For example, on the layout level, complex optical proximity correction techniques may be applied so as to modify the basic geometric layout of at least some device features in order to accommodate certain process variations that may occur, in particular during the imaging process. Although an increased degree of process robustness may be accomplished by using, for example, optical proximity correction techniques, it is nevertheless very difficult to identify the most critical overlap areas since at least two subsequent pattern transfer processes are involved so that a number of possible sources for generating overlay errors may be quite high so as to predict any such process variations by corresponding models used for OPC strategies. On the other hand, a direct observation of critical overlap areas is very difficult, since the underlying layer may not be accessible by well-established inspection techniques, such as scanning electron microscopy.

For these reasons, alternative strategies have been developed in order to identify critical overlap areas. For example, the lateral translation at specific locations within an image field of a lithography tool may be measured on the basis of specifically designed overlay targets. On the basis of the measurement data, a calculation of overlay performance across the entire image field may be performed by using simulation. The result of this procedure, however, strongly depends on the accuracy of the underlying model and the simulation algorithm. In other strategies, overlay performance is measured on the basis of electrical measurement procedures, for instance by forming contact chains and using contacts with a specified degree of "misalignment." This approach, however, is restricted to special structures and locations inside the image field or chip area. In other cases, yield measurement data may be used for identifying critical overlap areas wherein, however, a direct influence of critical overlap areas on the resulting final production yield is difficult to determine unless corresponding misalignments may be determined on the basis of cross-sectional electron microscopy measurements which, however, are very expensive due to the cross-sectional preparation of the samples. Furthermore, this strategy results in a very long response time so that identification of critical overlap areas may still result in significant yield loss due to a large number of inappropriately processed substrates. Furthermore, as discussed above, any algorithms to identify critical overlap structures in the basic semiconductor design may still require confirmation on substrate level and may not appropriately accommodate various process imperfections.

In view of the situation described above, the present disclosure relates to techniques and systems for identifying critical areas on forming overlapping device features in a semiconductor device while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and systems in which areas of a semiconductor device, which may be considered critical with respect to overlay accuracy and thus with respect to overlap failures, may be identified more efficiently by using appropriate detection methods that are readily available, for instance, by using defect detection or inspection techniques, thereby ensuring fast response times at reduced overall effort compared to conventional strategies. To this end, two subsequent layout layers of a semiconductor device may be transferred into the same material layer so as to obtain a combined pattern, which may then be examined on the basis of appropriate detection techniques without requiring expensive cross-sectional analysis processes. One illustrative method disclosed herein comprises transferring a first pattern of a first layout layer of a semiconductor device into a material layer that is formed above a first test region and a second test region of a substrate. The method further comprises transferring a second pattern of a second layout layer of the semiconductor device into the material layer formed above the first test region, wherein the first and second layout layers are spatially correlated to each other so as to define an overlap area. Moreover, the method comprises transferring a geometrically modulated version of the second pattern into the material layer formed above the second test region. Additionally, the method comprises determining a structural difference in the material layer between the first test region and the second test region so as to assess a process margin with respect to the overlap area.

A further illustrative method disclosed herein comprises forming a first combined pattern from a first layout layer and a second layout layer of a semiconductor device in a material layer that is formed in a first test region of a substrate, wherein the first and second layout patterns define an overlap area. The method further comprises forming a second combined pattern from the first layout layer and the second layout layer in the material layer that is formed in a second test region of the substrate, wherein the second combined pattern includes a geometric modulation relative to the first combined pattern. The method additionally comprises performing an inspection process at least for the overlap area in the first and second test regions.

One illustrative overlap detection system disclosed herein comprises an inspection tool configured to obtain first inspection data from a first test region that comprises a first combined pattern and to obtain second inspection data from a second test region that comprises a second combined pattern. The first and second combined patterns are each formed from a first layout layer and a second layout layer of a semiconductor device, wherein the second combined pattern is a modulated version of the first combined pattern. The overlap detection system further comprises a controller operatively connected so as to receive the first and second inspection data and configured to identify critical overlap areas in the first and second patterns by comparing the first and second inspection data and determining therefrom a structural difference between the first and second combined patterns.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to a process strategy and a corresponding system in which highly efficient and well-established inspection techniques, such as scanning electron microscopy and the like, may be used for identifying critical overlap areas. To this end, a device pattern corresponding to a layout pattern of a first layout layer may be transferred into an appropriate material layer, followed by the transfer of a second device pattern based on a second layout pattern of a layout layer in order to form a combined device pattern that is accessible by a corresponding inspection technique. The first and second layout layers are spatially correlated such that respective overlap areas are defined as required for the appropriate functionality of the integrated circuit under consideration. For example, the first layout layer may define conductive lines, such as gate electrode structures, drain and source regions and the like, which have to be contacted with respective contact elements, which thus represent device features of the second layout layer that has to be precisely aligned with respect to the underlying pattern. In other cases, a first metallization layer has to be connected to a subsequent metallization layer on the basis of corresponding vias, thereby requiring a precise overlap of the vias with metal lines of the underlying and/or overlying metallization layer.

Consequently, after transferring the different device patterns, which are spatially correlated to each other, into the same material layer, which may comprise two or more sub-layers, the combined pattern includes information on the resulting overlay accuracy and thus on performance of the overlap areas. In order to determine an appropriate process window, i.e., assessing the robustness of the corresponding basic device layout and design in combination with any involved imaging processes, a comparison may be made between two combined patterns, one of which may be formed on the basis of an intentionally introduced spatial or geometric modulation so as to enable the determination of the sensitivity of the layout and process strategy with respect to any process variations.

For example, in one illustrative embodiment, a combined pattern may be formed by transferring the first and second pattern on the basis of a given process strategy, while, in a further test region, the first and second patterns may be intentionally displaced to each other by a specified amount. In this manner, the structural difference of the two combined patterns may be readily determined on the basis of inspection techniques, thereby allowing a reliable assessment of the process robustness.

In other illustrative embodiments, the size of at least some device features in the first and/or the second pattern may be modified upon forming the second combined pattern, thereby also obtaining a structural difference between the two combined patterns, which may be readily determined and used for assessing overlap areas. The modification of the size of at least some of the pattern features may be accomplished by implementing different critical dimensions, for instance by appropriately adapting the imaging process and the like, using a dedicated modified pattern in the lithography mask and the like, while in other cases the magnification upon imaging the pattern from the lithography mask into the photoresist may be changed so as to obtain a global change of the lateral dimensions of the corresponding device features.

In other illustrative embodiments, a combination of a lateral translation and a change in size of at least some pattern features may be applied in order to obtain a structural difference between the two combined patterns.

The transfer of the patterns of the different layout layers may be accomplished on the basis of a lithography in combination with one or more etch processes, wherein, if desired, the same or different etch recipes may be applied so as to cover a desired range of process variations that may occur during the actual manufacturing process. In other illustrative embodiments, the pattern transfer may be accomplished on the basis of a lithography sequence only, i.e., on the basis of a process sequence involving an exposure process in combination with a development process, without actually requiring an anisotropic etch process. For example, double exposure techniques may be applied in which a latent image may be formed in a corresponding resist layer system which, therefore, after development is comprised of a combined pattern, which may be compared with the combined pattern obtained on a double exposure process wherein a specific geometric modulation may be implemented, as discussed above.

In further illustrative embodiments, the combined pattern may be transferred into a substantially homogenous material layer, for instance a typical hard mask material, or any other appropriate material, while, in other cases, the material layer may be provided in the form of two or more sub-layers in order to define different process conditions for transferring the different device patterns.

Figure 1A:
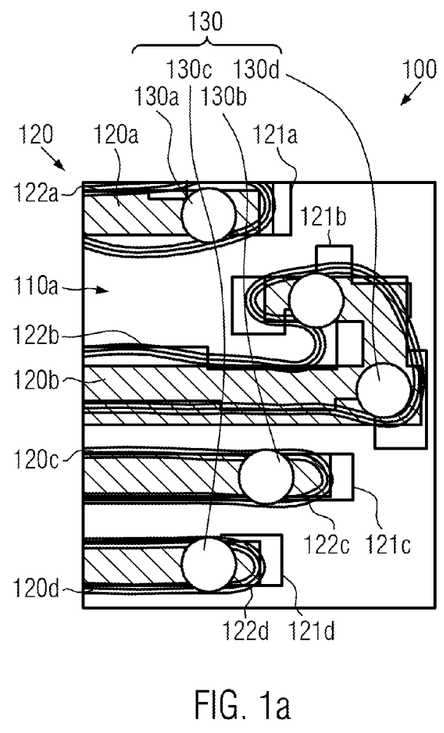
FIG. 1a schematically illustrates a top view of a test region of a semiconductor device in which a combined pattern is formed from two subsequent layout layers, according to illustrative embodiments.

FIG. 1a schematically illustrates a top view of a semiconductor device 100 which may represent a test substrate and the like which, however, may enable the application of process strategies which are also used in actual semiconductor devices during the various process steps involved in forming device patterns in various device layers. In FIG. 1a, a test region 110a is illustrated in top view in which a plurality of first pattern features 122a, 122b, 122c, 122d are formed in a material layer which, for convenience, is not shown in FIG. 1a. The pattern features 122a, 122b, 122c, 122d may represent a specific structure of the semiconductor device 100, which may also be used upon forming an actual semiconductor device. For example, the features 122a, 122b, 122c, 122d may represent conductive semiconductor lines, such as gate electrode structures, metal lines and the like, which have to be contacted. Hence, the patterns 122a, 122b, 122c, 122d represent features of a first layout layer 120, which in turn describes the two-dimensional geometric configuration of these features. For convenience, in FIG. 1a, the respective layout of the features 122a, 122b, 122c, 122d is also illustrated and indicated by reference numbers 120a, 120b, 120c, 120d. Moreover, the basic layout features 120a, 120b, 120c, 120d may be complemented by additional layout features 121a, 121b, 121c, 121d which may be obtained by, for instance, OPC techniques in order to compensate, at least to a certain degree, for any imperfections that may be introduced during the actual imaging of the layout features 120a, 120b, 120c, 120d into the device features 122a, 122b, 122c, 122d.

Moreover, a second pattern of features 130a, 130b, 130c, 130d is formed in the same material layer as the features 122a, 122b, 122c, 122d, wherein features 130a, 130b, 130c, 130d may represent areas requiring a precise overlap with the features 122a, 122b, 122c, 122d in an actual semiconductor device. For example, the features 130a, 130b, 130c, 130d may represent contact elements, vias and the like of a layout layer 130 that may have to be formed immediately above or immediately below the layout layer 120.

In the example shown in FIG. 1a, the process sequence used for forming the features 122a, 122b, 122c, 122d and 130a, 130b, 130c, 130d may result in a desired overlap of these features, however, without actually indicating which of these overlapped areas may respond in a very sensitive manner to any process fluctuations that may actually occur during a volume production process caused, for instance, by tool drifts, change of process recipes and the like.

Figure 1B:
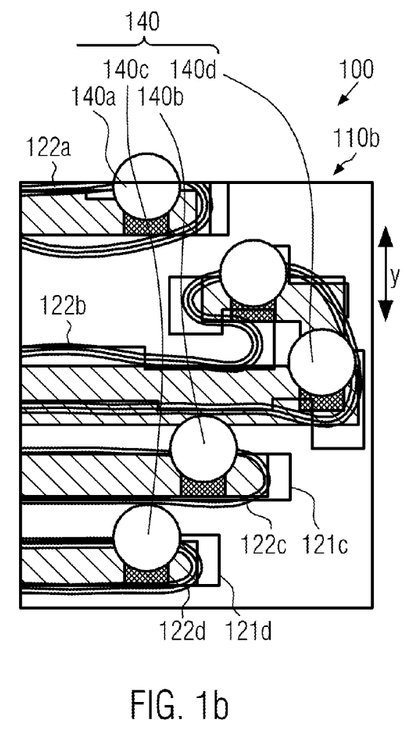
FIG. 1b schematically illustrates a top view of a second test region in which a combined pattern is formed so as to be spatially or geometrically modulated with respect to the first combined pattern in order to identify critical overlap areas, according to illustrative embodiments.

FIG. 1b schematically illustrates a top view of the device 100 wherein a second test region 110b is illustrated, in which basically the same pattern features 122a, 122b, 122c, 122d may be provided in the material layer, while, on the other hand, the features 130a, 130b, 130c, 130d may be formed in a geometrically modulated manner, thereby forming pattern features 140a, 140b, 140c, 140d. In the example shown in FIG. 1b, a geometric or spatial modulation may be obtained by applying a specified lateral translation, for instance in the positive y-direction by, for example, 20 nm, while also the overall size, i.e., the critical dimensions of the features 130a, 130b, 130c, 130d (FIG. 1a) has been increased by approximately 20 nm in order to obtain the features 140a, 140b, 140c, 140d. Consequently, by comparing the combined pattern of the test region 110a (FIG. 1a), that is, the features 122a, 122b, 122c, 122d in combination with the features 130a, 130b, 130c, 130d, with the combined pattern formed in the test region 110b, i.e., the combination of the features 122a, 122b, 122c, 122d and 140a, 140b, 140c, 140d, critical overlap areas may be identified. For example, as is evident from FIGS. 1a and 1b, the pattern feature 140b, which corresponds to the feature 130b, remains completely "overlapped," that is, the feature 140b is formed completely within the feature 122b, thereby indicating a high degree of process robustness of this overlap area. On the other hand, the features 140a, 140c and 140d are no longer fully overlapped, i.e., within the corresponding features 122a, 122c and 122d thereby indicating a reduced robustness with respect to process variations. In particular, the features 140c, 140d may result in severe device failures due to increased contact resistance and in particular due to a possible short circuit to the respective neighboring line structure. Consequently, based on the comparison between the test regions 110a, 110b, an appropriate process window may be determined and/or a corresponding redesign may be made in order to obtain superior process robustness. The comparison of the test regions 110a, 110b may be readily accomplished by using an appropriate system using an inspection tool or any other measurement technique in which the structural differences between the test regions 110a, 110b may be readily determined and correlated to overlap performance of the corresponding layout and/or process sequence under consideration. Corresponding manufacturing techniques and measurement strategies will be described later on with reference to FIGS. 2a-2i and 3.

Figure 2A:
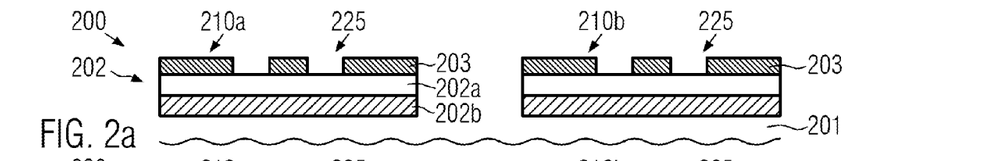
FIGS. 2a-2d schematically illustrate cross-sectional views of a semiconductor device comprising two test regions for forming combined patterns in a material layer so as to identify critical overlap areas during various manufacturing stages, according to illustrative embodiments.

FIG. 2a schematically illustrates a cross-sectional view of a semiconductor device 200, for instance provided in the form of a test device and the like, in which a first test region 210a and at least one second test region 210b may be provided so as to form respective combined patterns therein, which may be accessible by well-established inspection techniques. As shown, the device 200 may comprise a substrate 201, such as a semiconductor substrate and the like. Moreover, a material layer 202 may be formed above the substrate 201 and may thus extend in or above the test regions 210a, 210b. The material layer 202 may be appropriate for forming therein a combined pattern on the basis of two pattern transfer processes wherein, in one of the test regions, a geometric modulation may be applied so as to create a systematic difference with respect to the resulting combined patterns in these test regions. In order to form a combined pattern in the material layer 202, any appropriate configuration and material composition may be used. For example, a substantially homogeneous material composition (not shown) may be used in the layer 202, for instance based on well-established hard mask materials such as silicon dioxide, silicon nitride, silicon oxynitride and the like, while, in other cases, organic materials such as polymer materials and the like may be used. In still other cases, the material layer 202 may represent one or more layers of radiation-sensitive material thereby enabling a patterning of the layer 202 on the basis of two or more subsequent exposure processes and one or more development processes, as, for instance, used in double exposure lithography techniques. In the embodiment shown in FIG. 2a, the layer 202 may be comprised of a first sub-layer 202a and a second sub-layer 202b, which may be of substantially the same or different material composition. For example, one or both of the layers 202a, 202b may be provided in the form of a dielectric anti-reflective coating (ARC) material as is well established in the art of forming semiconductor devices. In other cases, a single layer of an ARC material may be used for the layer 202.

In the manufacturing stage shown, a mask layer 203, such as a resist material, having formed therein a first pattern 225 may be provided above the layer 202 in order to enable a subsequent transfer of the pattern 225 into at least a portion of the layer 202. It should be appreciated that the pattern 225 may correspond to a corresponding layout pattern of a first layout layer of the device 200, as, for instance, discussed above with reference to the device 100. It should be appreciated, however, that the pattern 225 may have certain differences with respect to a corresponding initial layout pattern or also in comparison with a corresponding pattern formed on a lithography mask due to any imperfections that may be involved in the imaging process for transferring the pattern of a lithography mask into a radiation-sensitive material such as the layer 203, as is also previously discussed. Similarly, the layer 203 may be formed on the layer 202 in the second test region 210b and may have formed therein substantially the same pattern 225, except for minor variations, which may be caused, for instance, by the different position of the regions 210a, 210b within the substrate 201. For example, the test regions 210a, 210b may be formed on the basis of different image fields of the corresponding lithography tool, thereby possibly introducing certain differences between the pattern 225 in the test region 210a and the pattern 225 in the test region 210b.

The device 200 as illustrated in FIG. 2a may be formed on the basis of any well-established process techniques in which the layer 202 may be applied, for instance, by chemical vapor deposition (CVD) techniques, spin-on techniques and the like. Furthermore, any additional treatments may be performed so as to obtain the desired material characteristics. It should be appreciated that the layer 202 may be formed above any appropriate substrate without requiring any specific processed device layers below the material layer 202. In other cases, the further processed layers may be formed below the layer 202, if considered appropriate. Thereafter, the mask layer 203 may be applied and a lithography process may be used in order to form the pattern 225 in the layer 203, which may include different exposure steps when the regions 210a, 210b are provided in different image fields of the lithography tool. In other cases, the regions 210a, 210b may be formed during the same lithography process. It should be understood that the lithography process may also include any pre-treatments and post-treatments of the layer 203 prior to and after the exposure step and may also include a development process so as to form the patterns 225 from a previously generated latent image in the layer 203.

Thereafter, appropriate etch recipes may be used for transferring the pattern 225 into the material layer 202, for instance into the upper layer 202a, which may be accomplished by using well-established anisotropic etch recipes and using the layer 203 as an etch mask.

Figure 2B:
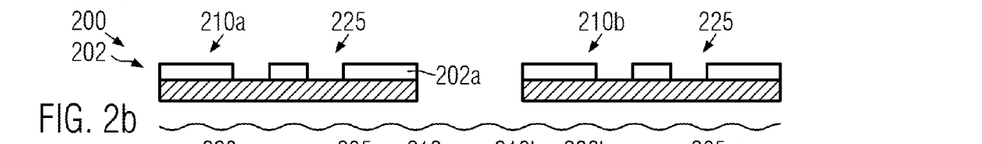

FIG. 2b schematically illustrates a device 200 in a further advanced manufacturing stage in which the mask layer 203 is removed and the pattern 225 is transferred into the layer 202a. It should be appreciated, however, that the pattern 225 in the layer 202a may differ to some extent from the layer 225 formed in the mask layer 203 (FIG. 2a) due to the etch process applied. For example, the cross-sectional profile and/or the critical dimension of respective openings may differ in the patterns 225 of FIGS. 2a and 2b.

Figure 2C:
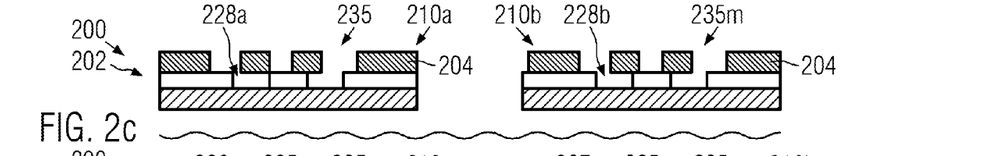

FIG. 2c schematically illustrates the device 200 in a further advanced manufacturing stage in which a second mask layer 204 may be formed above the layer 202 and may have incorporated therein a second pattern 235, which corresponds to a second layout layer of the device 200, as is also discussed above with reference to FIGS. 1a and 1b. That is, the patterns 225 and 235 have a spatial correlation to each other such that one or more overlap areas are defined. For example, an overlap area 228a is indicated in FIG. 2c. With respect to forming the mask layer 204 and obtaining the pattern 235 therein, the same criteria may apply as previously discussed. That is, any well-established lithography sequence may be applied so as to form the patterned mask layer 204. It should be appreciated that the previously formed surface topography may be planarized, if considered necessary, by using any appropriate planarization techniques, such as using optical planarization materials and the like. In the second test region 210b, the layer 204 is provided with a pattern 235m, which is to be understood as a spatially or geometrically modulated version of the pattern 235. That is, the patterns 235, 235m have a high degree of similarity wherein, in addition to possible statistical fluctuations, a systematic deviation is introduced in order to create a systematic difference of the resulting combined pattern in the layer 202 between the test regions 210a and 210b. For example, as discussed above, the size and/or position of at least some of the pattern features of the pattern 235m may be modified with respect to the pattern 235. In the example shown, a lateral translation in the +y-direction may be applied upon forming the pattern 235m, while any critical dimensions may be preserved, except for any minor process fluctuations as discussed above. Thereafter, an appropriate etch process may be applied which may be performed on the basis of the same process recipe as used for forming the pattern 225 in the layer 202 or wherein a different process recipe may be used, depending on the overall process strategy.

Figure 2D:
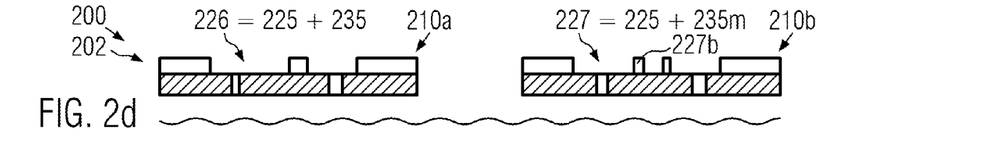

FIG. 2d schematically illustrates the device 200 in a further advanced manufacturing stage in which a combined pattern 226 is formed in the layer 202 which is the combination of the patterns 225 and 235 in the test region 210a. Similarly, in the test region 210b, a combined pattern 227 is obtained, which is a combination of the pattern 225 and 235m. Due to the systematic geometric modulation of the pattern 235m with respect to the pattern 235, a structural difference is obtained, for instance in the form of an additional device feature or "defect" 227b, which is readily detectable by well-established defect inspection techniques. Moreover, measurement of critical dimensions and overlay accuracy may be applied and/or generally a process window qualification technique, for instance based on scanning electron microscopy and the like, may be used for detecting the structural difference 227b. Based on the detected structural difference 227b, an assessment with respect to overlap performance of the involved basic layout and process strategy may be made. For example, the size of the structural difference 227b may be determined and may be used as a criterion for assessing validity of a basic device layout and/or a corresponding process sequence.

It should be appreciated that different materials and/or process recipes and strategies may be used in comparing the combined patterns in order to provide superior coverage of the resulting assessment. Furthermore, by using different process strategies and/or configurations of the test regions, a corresponding variety of process fluctuations may be "simulated" in order to enable a robust definition of a reliable process window with respect to forming overlapping areas, such as contact and vias with respect to conductive lines, as, for instance, explained above with reference to FIGS. 1a and 1b.

With reference to FIGS. 2e-2h, a similar process sequence for forming the combined patterns 226, 227 may be described, wherein one or more process parameters, however, are selected differently, for instance with respect to enhancing defect detection and the like.

Figure 2E:
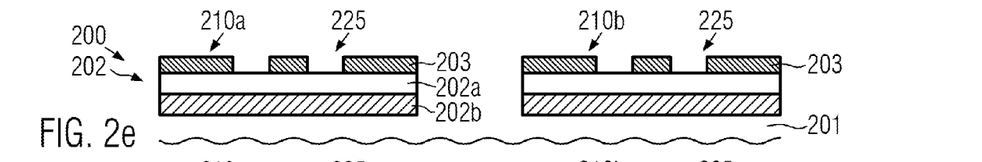
FIGS. 2e-2h schematically illustrate cross-sectional views of the semiconductor device according to further illustrative embodiments in which a different type of etch recipe and/or a different material composition of the material layer may be used, according to further illustrative embodiments.

FIG. 2e schematically illustrates the device 200 in a similar configuration as previously described with reference to FIG. 2a. Thus, the layer 203 comprises the patterns 225, which have to be transferred into the layer 202. In this case, however, an increased etch time may be applied so as to "simulate" corresponding process variations, which may result in a corresponding modification of the pattern 225 and which may also result in an increased etch depth within the layer 202.

Figure 2F:
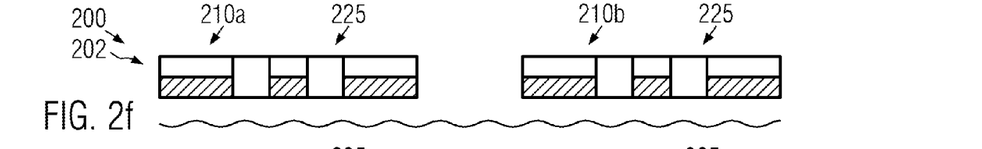

FIG. 2f schematically illustrates the device 200 in a further advanced manufacturing stage in which substantially twice the etch time has been applied in order to transfer the pattern 225 into the layer 202. In this case, the layers 202a, 202b may have the same material composition thereby patterning both the layer 202a and 202b, depending on their initial thickness.

Figure 2G:
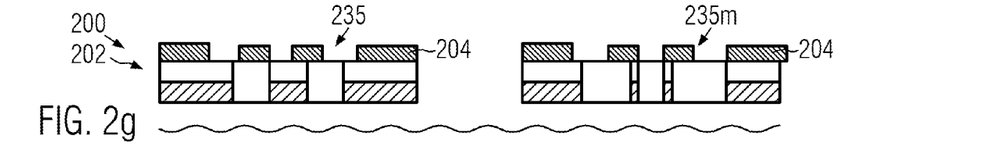

FIG. 2g schematically illustrates the device 200 with the layer 204 having incorporated therein the pattern 235 in the first test region 210a and the geometrically modulated pattern 235m in the second test region 210b. Also in this case, the respective patterns are transferred into the layer 202, for instance by using the same etch recipe as above.

Figure 2H:
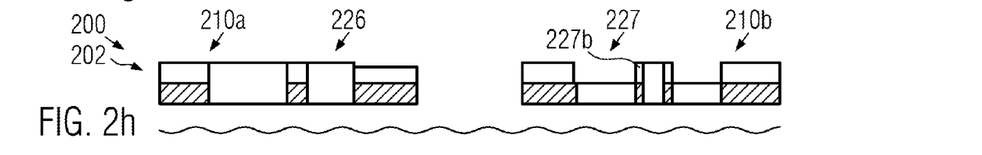

FIG. 2h schematically illustrates the combined pattern 226 in the test region 210a and the combined pattern 227 in the test region 210b, wherein also the structural difference 227b may result due to the systematic geometrical modulation, as discussed above. It should be appreciated, however, that, due to the different process parameters, such as the different etch time, generally the structural difference 227b may differ from the previously obtained structural difference. In this manner, various influences of differences in the process strategy may be quantitatively assessed by comparing the corresponding "defects" 227b.

It should be appreciated that, in addition or alternatively to a modification of the process recipe or process time, other differences may be used so as to obtain a statistically meaningful result and a broad coverage of process fluctuations. For example, the pattern 235m may be provided with different types of modulation in the device 200, for instance by providing a plurality of different test regions, which may be processed on the basis of the same or different process strategies.

Figure 2I:
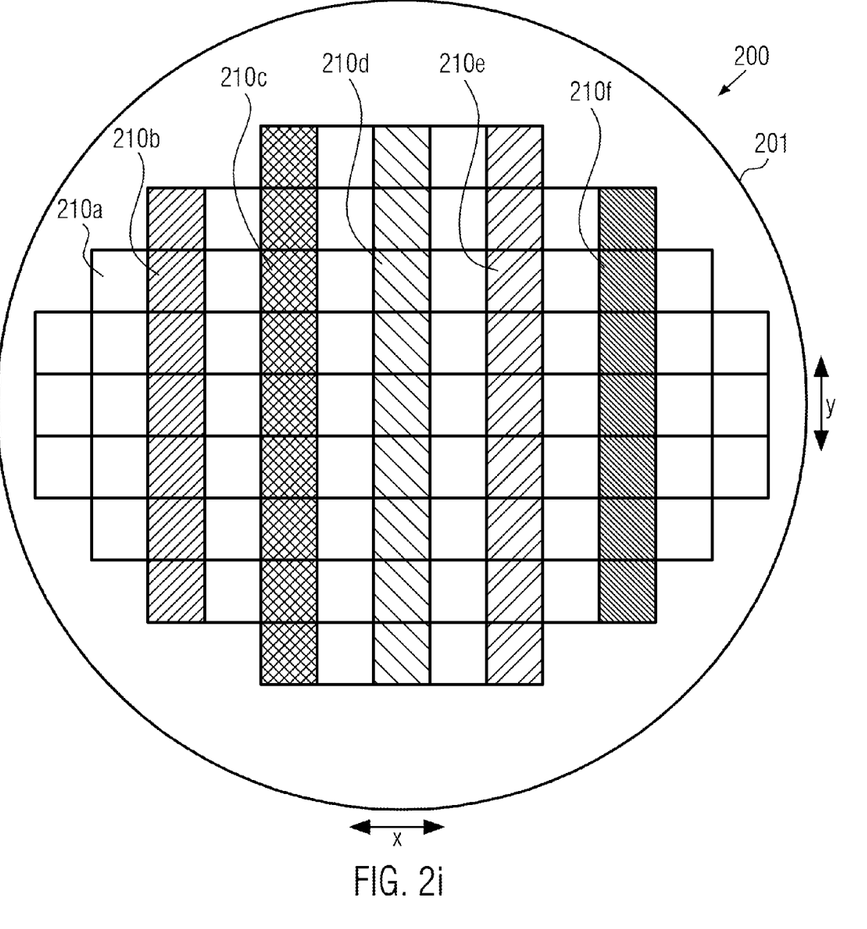
FIG. 2i schematically illustrates a top view of a test substrate including a plurality of test regions with different geometric modulations in order to identify critical overlap areas with statistical relevance, according to illustrative embodiments.

FIG. 2i schematically illustrates a top view of a device 200 wherein a plurality of test regions 210a, 210b, 210c, 210d, 210e, 210f may be formed on the substrate 201 in order to obtain a broad coverage of various influences for forming overlap areas and to achieve statistic relevance for each of the different types of test regions. For example, a plurality of test regions 210a may be provided in close proximity to respective test regions having formed therein geometrically modulated patterns, as described above. For example, test regions 210a, which may basically correspond to the test region 210a described above, may thus cover the substrate 201 in the x-direction and the y-direction so as to efficiently enable the evaluation of across-substrate variations. Similarly, a plurality of test regions 210b may be provided in which a combined pattern may be formed on the basis of a lateral translation in the +x-direction wherein an appropriate magnitude of the translation may be used, for example, 25 nm may be used. Similarly, the test regions 210c may be formed on the basis of a lateral translation in the +x-direction wherein the same or a different magnitude may be used. For example, 50 nm may be used. Similarly, test regions 210e, 210f may be provided with combined patterns formed on the basis of a lateral translation in the y-direction, for instance using +50 nm and -25 nm. On the other hand, the test regions 210d may be provided with a combined pattern that is formed on the basis of a modulation of the critical dimension involved, for instance by increasing the critical dimension by 10 nm.

Hence, upon inspecting the substrate 201 on the basis of any appropriate inspection technique, structural differences between neighboring regions 210a and regions 210b, 210c, 210d, 210e, 210f may be used so as to identify critical overlap areas. Furthermore, due to the provision of a plurality of test regions for each type, a statistically relevant result may be obtained, while the different types of test regions further allow the assessment of a performance on the basis of a wide variety of fluctuations. It should be appreciated that the above configuration of test regions and the parameters for geometrically modulating the combined patterns in the respective test regions are of illustrative nature only and any other geometric modulation may be applied, for instance, by using any magnitude for a translation and/or modification of size of the underlying layout pattern.

Figure 3:
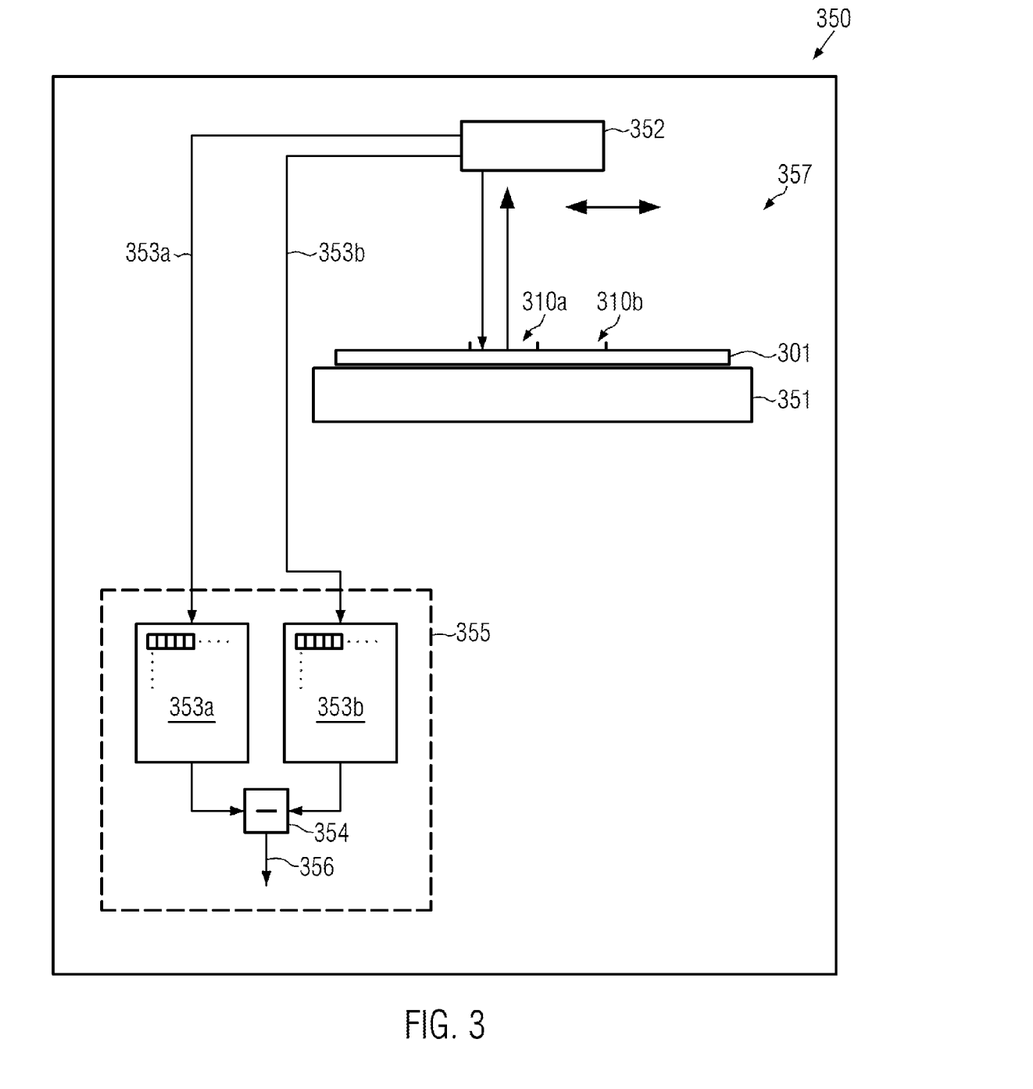
FIG. 3 schematically illustrates a system for detecting critical overlap areas, according to still further illustrative embodiments.

FIG. 3 schematically illustrates a system 350 that may be used for detecting critical overlap areas and thus for assessing and evaluating overlay performance of a specific device design and/or a process flow for manufacturing the same. As shown, the system 350 may comprise an inspection tool 357, for instance appropriately configured to determine critical dimensions, overlay errors, surface defects and the like, which may comprise a substrate holder 351 on which a substrate 301 may be positioned, which may comprise at least two test regions 310a, 310b having formed therein a combined pattern, as previously discussed with reference to FIGS. 1a-1b and 2a-2i. That is, the test region 310a comprises a patterned material layer having formed therein a combined pattern formed on the basis of patterns corresponding to two different device levels so as to define an overlap area, wherein the respective combined patterns in the regions 310a, 310b differ from each other by a systematic geometric modulation. The substrate holder 351 is appropriately configured so as to enable a relative lateral motion between the substrate 301 and a detector 352, which may receive any type of radiation-responsive beam incident on the substrate 301. For example, an electron beam may be used for determining surface characteristics of the substrate 301 by means of the detected radiation generated by the incident electron beam. In other cases, any other type of radiation, such as ultraviolet radiation and the like, may be used to determine overlay characteristics and/or characteristics of critical dimensions. The detector 352 is appropriately configured to provide inspection data 353a, 353b, which may have encoded therein structural information, for instance critical dimensions, the size of certain objects and the like. Moreover, the system 350 may comprise a controller 355 that is appropriately configured to receive the inspection data 353a, 353b which, for instance, may be provided in the form of a bit map and the like, so as to allow a quantitative evaluation of pixels that correspond to the regions 310a, 310b, respectively, or a portion thereof. For example, the data 353a, 353b may each represent an image field formed by a lithography process.

Moreover, the controller 355 may comprise a comparator 354 in which the inspection data 353a may be compared with the data 353b, for instance by a pixel-wise comparison in order to detect structural differences, which in turn may be used for evaluating overlay performance of a specific layout and/or a process flow, as is also discussed above. Consequently, the comparator 354 may provide respective data 356 which may indicate overlay performance of the layout and the process sequence applied for forming the test regions 310a, 310b. For example, the presence of "defects" in one of the regions 310a, 310b compared to the other one of these test regions may indicate invalidity of corresponding design and/or process sequences for a given range of possible process fluctuations, which may be simulated on the basis of the corresponding geometric modulation, as is also discussed above.

As a result, the present disclosure provides techniques and systems in which overlay performance may be evaluated on the basis of fast and reliable measurement techniques, for instance using defect inspection tools. To this end, an appropriate test substrate may be formed without requiring a fully processed substrate and avoiding any sophisticated preparation techniques, for instance the preparation of cross-sectional samples for TEM measurements. According to the principles disclosed herein, a direct inspection of critical locations with respect to overlap accuracy may enable a fast response to any process fluctuations and may also allow a reliable and robust definition of process windows for forming overlap areas.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    transferring a first pattern of a first layout layer of a semiconductor device into a material layer formed above a first test region and a second test region of a substrate;
    transferring a second pattern of a second layout layer of said semiconductor device into said material layer formed above said first test region, said first and second layout layers being spatially correlated to each other so as to define an overlap area;
    transferring a geometrically modulated version of said second pattern into said material layer formed above said second test region; and
    determining a structural difference in said material layer between said first test region and said second test region so as to assess a process margin with respect to said overlap area.

2. The method of claim 1, wherein transferring a geometrically modulated version of said second pattern into said material layer formed above said second test region comprises applying a predefined lateral translation of said second pattern relative to said first pattern.

3. The method of claim 1, wherein transferring a geometrically modulated version of said second pattern into said material layer formed above said second test region comprises providing said geometrically modulated version by using at least some pattern features of said second pattern with a different critical dimension.

4. The method of claim 1, wherein transferring a geometrically modulated version of said second pattern into said material layer formed above said second test region comprises modifying a lateral dimension of at least some pattern features of said second pattern and applying a predefined lateral translation to said second pattern having said at least some features with a modified lateral dimension.

5. The method of claim 1, wherein transferring at least one of said first and second patterns into said material layer comprises performing a lithography process and at least one etch process.

6. The method of claim 5, wherein transferring said first pattern into said material layer comprises performing a first etch process and wherein transferring said second pattern and said geometrically modulated version of said second pattern into said material layer comprises performing a second etch process.

7. The method of claim 6, wherein said first and second etch processes are performed by using the same process recipe.

8. The method of claim 1, wherein transferring said first and second patterns and said modulated version of said second pattern comprises performing a sequence of lithography process without an etch process.

9. The method of claim 1, wherein said material layer is a homogenous material layer.

10. The method of claim 1, wherein said material layer comprises a first sub-layer and a second sub-layer.

11. The method of claim 1, wherein determining a structural difference between said first test region and said second test region comprises performing a substrate inspection process.

* * * * *